United States Patent
Ichinokura

(10) Patent No.: US 11,217,730 B2
(45) Date of Patent: Jan. 4, 2022

(54) OPTICAL SEMICONDUCTOR APPARATUS AND METHOD OF MANUFACTURING OPTICAL SEMICONDUCTOR APPARATUS

(71) Applicant: Nikkiso Co., Ltd, Tokyo (JP)

(72) Inventor: Hiroyasu Ichinokura, Hakusan (JP)

(73) Assignee: NIKKISO CO., LTD., Tokyo (JP)

(*) Notice: Subject to any disclaimer, the term of this patent is extended or adjusted under 35 U.S.C. 154(b) by 191 days.

(21) Appl. No.: 16/284,310

(22) Filed: Feb. 25, 2019

(65) Prior Publication Data

US 2019/0189861 A1   Jun. 20, 2019

Related U.S. Application Data

(63) Continuation of application No. PCT/JP2017/029116, filed on Aug. 10, 2017.

(30) Foreign Application Priority Data

Sep. 1, 2016  (JP) .............................. JP2016-171231

(51) Int. Cl.
*H01L 33/48* (2010.01)
*H01L 33/62* (2010.01)
(Continued)

(52) U.S. Cl.
CPC .......... *H01L 33/486* (2013.01); *H01L 23/057* (2013.01); *H01L 23/10* (2013.01); *H01L 33/62* (2013.01); *H01L 2933/0033* (2013.01)

(58) Field of Classification Search
CPC .................. H01L 33/486; H01L 33/62; H01L 2933/0033; H01L 31/0203; H01L 51/448
See application file for complete search history.

(56) References Cited

U.S. PATENT DOCUMENTS

| 2015/0014711 | A1 | 1/2015 | Bergenek et al. |
| 2016/0136312 | A1* | 5/2016 | Park ..................... F21V 33/0044 |
| | | | 362/231 |
| 2017/0263833 | A1* | 9/2017 | Chiu ....................... H01L 33/62 |

FOREIGN PATENT DOCUMENTS

| JP | S6010757 A | 1/1985 |
| JP | H06204352 A | 7/1994 |

(Continued)

OTHER PUBLICATIONS

An International Search Report dated Oct. 31, 2017 in corresponding Application No. PCT/JP2017/029116 is attached.
(Continued)

*Primary Examiner* — Brigitte A Paterson
(74) *Attorney, Agent, or Firm* — Muncy, Geissler, Olds & Lowe, P.C.

(57) ABSTRACT

A light emitting apparatus includes: a package substrate; a light emitting device housed in a recess of the package substrate; a window member provided to cover an opening of the recess; and a sealing structure that seals a space between the package substrate and the window member. The window member includes a glass plate having an inner surface that faces the optical semiconductor device and a frame body provided on the inner surface of the glass plate. The sealing structure includes a first metal layer provided on a top surface of the package substrate, a second metal layer provided on a bottom surface and an inner circumferential surface of the frame body, and a metal bonding part provided between the first and second metal layers, at least a portion of the metal bonding part being provided on the inner circumferential surface.

9 Claims, 4 Drawing Sheets

(51) Int. Cl.
*H01L 23/057* (2006.01)
*H01L 23/10* (2006.01)

(56) References Cited

FOREIGN PATENT DOCUMENTS

| JP | 2005191314 A | | 7/2005 | |
|---|---|---|---|---|
| JP | 2015018873 | * | 7/2013 | ... H01L 2224/48091 |
| JP | 2015018873 A | | 1/2015 | |

OTHER PUBLICATIONS

A Written Opinion dated Oct. 31, 2017 in corresponding Application No. PCT/JP2017/029116 is attached.
International Preliminary Report on Patentability dated Sep. 12, 2018 in corresponding Application No. PCT/JP2017/029116 is attached.
An Office Action dated Sep. 5, 2018 in corresponding TW Application No. 106128983 is attached.
An Office Action dated Oct. 17, 2017 in corresponding JP Application No. 2016-171231 is attached.

* cited by examiner

OPTICAL SEMICONDUCTOR APPARATUS AND METHOD OF MANUFACTURING OPTICAL SEMICONDUCTOR APPARATUS

RELATED APPLICATION

Priority is claimed to Japanese Patent Application No. 2016-171231, filed on Sep. 1, 2016, the entire content of which is incorporated herein by reference.

BACKGROUND OF THE INVENTION

1. Field of the Invention

The present invention relates to optical semiconductor apparatuses, and, more particularly, to an optical semiconductor apparatus including an optical semiconductor device.

2. Description of the Related Art

Nowadays, semiconductor light emitting devices such as light emitting diodes and laser diodes that emit blue light have been in practical use. Development of light emitting devices that output deep ultraviolet light having a shorter wavelength has also been pursued. Deep ultraviolet light has sterilization capability. Semiconductor light emitting devices capable of outputting deep ultraviolet light have therefore attracted attention as a mercury free sterilization light source in medical and food processing fronts. Recently, efforts have been made to develop semiconductor light emitting devices with a higher emission intensity, irrespective of the output wavelength.

A light emitting device is housed in a package to protect the device from an external environment. For example, a light emitting device is sealed by bonding a substrate on which the light emitting device is mounted and a lid body provided on the substrate. A lid body is built by setting a translucent window member in an opening of a metal frame body. A metal seal ring is provided on the outer circumference of the substrate, and the lid body is fitted between the metal frame body and the seal ring via a brazing filler metal.

In bonding the substrate and the lid body via a brazing filler metal, it is desired to seal them while a load is being applied to the brazing filler metal between the substrate and the lid body in order to improve the quality of bonding. If a portion of the brazing filler metal extruded from between the substrate and the lid body flows toward the packaging surface of the light emitting device, a short circuit between wires may occur and lower the manufacturing yield.

SUMMARY OF THE INVENTION

In this background, an illustrative purpose of the present invention is to provide a technology of improving the reliability and manufacturing yield of an optical semiconductor apparatus.

An optical semiconductor apparatus according to an embodiment includes: a package substrate that includes a recess that opens on a top surface of the package substrate; an optical semiconductor device housed in the recess; a window member provided to cover an opening of the recess; and a sealing structure that seals a space between the package substrate and the window member. The window member includes a glass plate having an inner surface that faces the optical semiconductor device and a frame body provided on the inner surface of the glass plate, and the sealing structure includes a first metal layer provided in a shape of a frame on the top surface of the package substrate, a second metal layer provided on a bottom surface and an inner circumferential surface of the frame body, and a metal bonding part provided between the first metal layer and the second metal layer, at least a portion of the metal bonding part being provided on the inner circumferential surface.

According to the embodiment, the metal layer is provided on the inner circumferential surface. Therefore, the metal bonding member extruded from between bottom surface the frame body will be stretched in the upward direction along the inner circumferential surface of the frame body as the bonding member is formed while a load is being applied between the top surface of the package substrate and the frame body. As a result, the extruded bonding member is prevented from flowing toward the recess of the substrate, and the bonding member is allowed to stay in the neighborhood of the frame body. This improves the manufacturing yield in the bonding process and realizes a highly reliable sealing structure through a bonding process that involves application of a load.

An outer dimension of the frame body may be smaller than an outer dimension of the package substrate, and an inner dimension of the frame body may be larger than an inner dimension of the recess of the package substrate.

A height of the frame body from the bottom surface to the inner surface of the glass plate may be not less than 10 μm and not more than 200 μm.

The optical semiconductor device may be a light emitting device configured to emit deep ultraviolet light, and the window member may be configured such that transmittance for the deep ultraviolet light is 80% or higher.

The glass plate may be made from a borate glass having a thickness of 300 μm or smaller, the frame body may be made of a kovar alloy, and the metal bonding part may include gold-tin (AuSn).

Another embodiment relates to a method of manufacturing an optical semiconductor apparatus. The method includes: housing an optical semiconductor device in a recess of a package substrate, the recess opening on a top surface of the package substrate; providing a window member to cover an opening of the recess; and sealing a space between the package substrate and the window member. The window member includes a glass plate having an inner surface that faces the optical semiconductor device and a frame body provided on an inner surface of the glass plate. A first metal layer is provided in a shape of a frame on the top surface of the package substrate, a second metal layer is provided on a bottom surface and an inner circumferential surface of the frame body, and the sealing includes heating a metal bonding member provided between the first metal layer and the second metal layer while a load is being applied between the package substrate and the window member.

According to the embodiment, the metal layer is provided on the inner circumferential surface. Therefore, the metal bonding member extruded from between bottom surface the frame body will be stretched in the upward direction along the inner circumferential surface of the frame body as the metal bonding member is heated and melted while a load is being applied between the top surface of the package substrate and the frame body. As a result, the extruded metal bonding member is prevented from flowing toward the recess of the substrate, and the metal bonding member is allowed to stay in the neighborhood of the frame body. This improves the manufacturing yield in the bonding process and realizes a highly reliable sealing structure through a bonding process that involves application of a load.

The sealing may include cooling the metal bonding member while a load is being applied between the package substrate and the window member, after heating the metal bonding member.

The metal bonding member may be an gold-tin (AuSn) metal plate having a shape of a frame corresponding to the bottom surface of the frame body.

BRIEF DESCRIPTION OF THE DRAWINGS

Embodiments will now be described, by way of example only, with reference to the accompanying drawings that are meant to be exemplary, not limiting, and wherein like elements are numbered alike in several figures, in which.

DETAILED DESCRIPTION OF THE INVENTION

Figure 1:
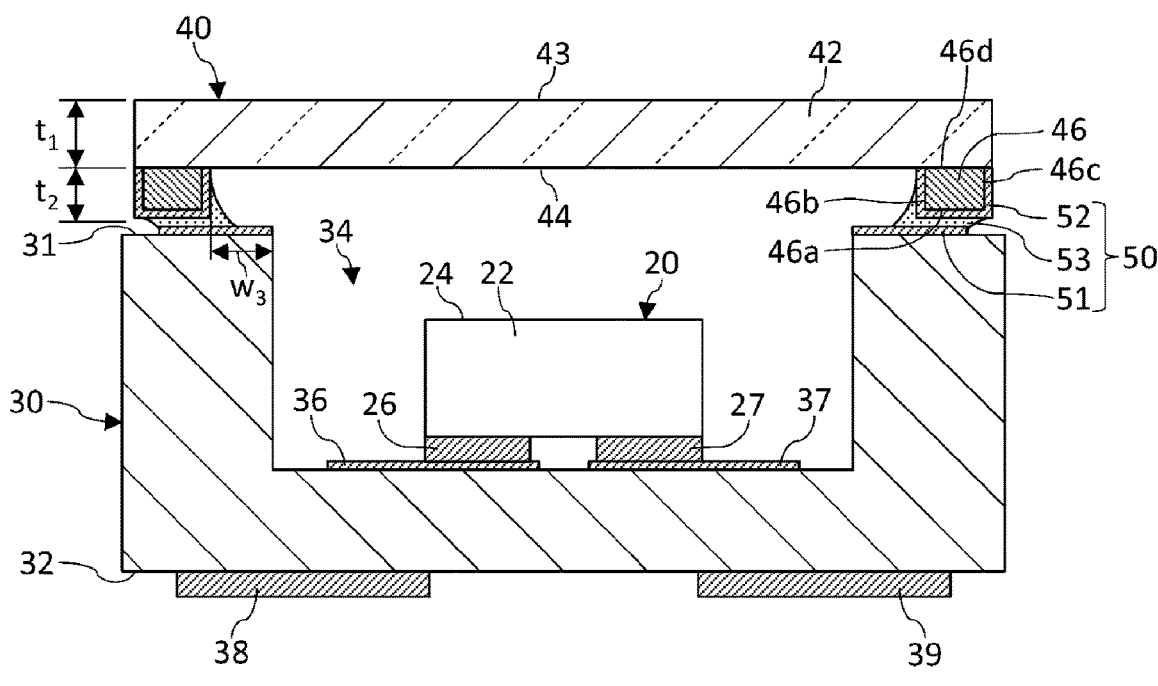
FIG. 1 is a cross-sectional view schematically showing a light emitting apparatus according to an embodiment.

The invention will now be described by reference to the preferred embodiments. This does not intend to limit the scope of the present invention, but to exemplify the invention.

A detailed description will be given of embodiments of the present invention with reference to the drawings. Like numerals are used in the description to denote like elements and duplicate descriptions are omitted as appropriate. To facilitate the understanding, the relative dimensions of the constituting elements in the drawings do not necessarily mirror the relative dimensions in the actual apparatus.

Figure 2:
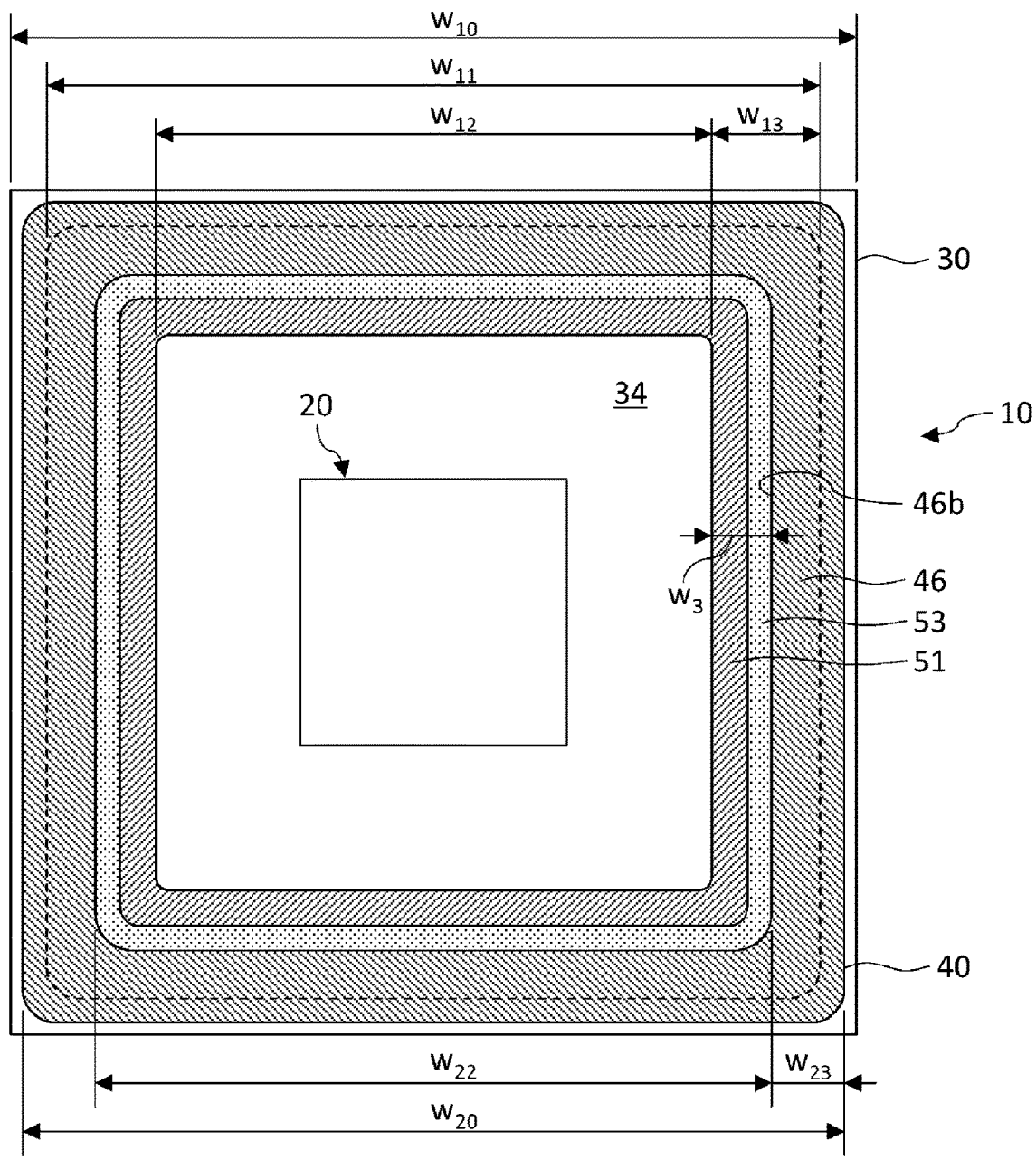
FIG. 2 is a top view schematically showing the light emitting apparatus of FIG. 1.

FIG. 1 is a cross-sectional view schematically showing a light emitting apparatus 10 according to an embodiment, and FIG. 2 is a top view schematically showing the light emitting apparatus 10 of FIG. 1. The light emitting apparatus 10 includes a light emitting device 20, a package substrate 30, a window member 40, and a sealing structure 50. The light emitting apparatus 10 is an optical semiconductor apparatus including the light emitting device 20, which is an optical semiconductor device.

The light emitting device 20 is a light emitting diode (LED) chip configured to emit "deep ultraviolet light" having a central wavelength λ of about 360 nm or smaller. To output deep ultraviolet light having such a wavelength, the light emitting device 20 is made of an aluminum gallium nitride (AlGaN) based semiconductor material having a band gap of about 3.4 eV or larger. The embodiment particularly discusses a case of emitting deep ultraviolet light having a central wavelength λ of about 240 nm~350 nm.

The light emitting device 20 includes a semiconductor stack structure 22, a light emission surface 24, a first device electrode 26, and a second device electrode 27.

The semiconductor stack structure 22 includes a template layer, an n-type clad layer, an active layer, a p-type clad layer, etc. built on a substrate that embodies the light emission surface 24. When the light emitting device 20 is configured to output deep ultraviolet light, a sapphire ($Al_2O_3$) substrate is used as the substrate embodying the light emission surface 24, and an aluminum nitride (AlN) layer is used as the template layer of the semiconductor stack structure 22. The clad layer and the active layer of the semiconductor stack structure 22 are made of an AlGaN-based semiconductor material.

The first device electrode 26 and the second device electrode 27 are electrodes for supplying carriers to the active layer of the semiconductor stack structure 22 and are an anode electrode and a cathode electrode, respectively. The first device electrode 26 and the second device electrode 27 are provided opposite to the light emission surface 24. The first device electrode 26 is attached to a first inner electrode 36 of the package substrate 30, and the second device electrode 27 is attached to a second inner electrode 37 of the package substrate 30.

The package substrate 30 is a rectangular member having a top surface 31 and a bottom surface 32. The package substrate 30 is a ceramic substrate that contains alumina ($Al_2O_3$), aluminum nitride (AlN), etc. and is a so-called high temperature co-fired ceramic (HTCC) multilayer substrate.

A recess 34 for housing the light emitting device 20 is provided on the top surface 31 of the package substrate 30. The first inner electrode 36 and the second inner electrode 37 to which the light emitting device 20 is attached are provided on the bottom surface of the recess 34. On the bottom surface 32 of the package substrate 30 are provided a first outer electrode 38 and a second outer electrode 39 for mounting the light emitting apparatus 10 on, for example, an external substrate.

The window member 40 is a protective member provided to cover the opening of the recess 34. The ultraviolet light emitted by the light emitting device 20 is output via the window member 40 from an outer surface 43 of the window member 40 to a space outside the package. The window member 40 includes a glass plate 42 and a frame body 46.

The glass plate 42 has a rectangular shape and are chamfered into a round form at the four corners. The glass plate 42 is preferably made of a material having a high deep ultraviolet transmittance and having a coefficient of thermal expansion close that of the frame body 46. For example, the glass plate 42 is made from a borate glass such as a borosilicate glass. The glass plate 42 is formed to be thin such that the transmittance for the deep ultraviolet light emitted by the light emitting device 20 is 80% or higher, and, preferably, 85% or higher. It is desired that the thickness $t_1$ of the glass plate 42 be, for example, 300 µm or smaller, and, preferably, about 150-200 µm. The glass plate 42 may be made of quartz glass having a high deep ultraviolet transmittance.

The frame body 46 is a so-called seal ring which is formed in a rectangular frame shape and chamfered into a round form at the four corners. The frame body 46 has the same outer dimension as the glass plate 42 and has an inner dimension larger than the recess 34 of the package substrate 30. The frame body 46 is provided on an inner surface 44 of the glass plate 42 and is fitted along the outer circumference of the glass plate 42. It is desired that the frame body 46 be made of a material having a coefficient of thermal expansion close to that of the glass plate 42. For example, it is desired that the frame body 46 be made of a kovar alloy, which is one of iron-nickel-cobalt alloys.

The frame body 46 includes a bottom surface 46a, an inner circumferential surface 46b, an outer circumferential surface 46c, and a top surface 46d. The bottom surface 46a faces the top surface 31 of the package substrate 30. The inner circumferential surface 46b is a surface positioned between the bottom surface 46a and the inner surface 44 of the glass plate 42 and exposed to a space inside the package. The outer circumferential surface 46c is a side surface exposed to a space outside the package. The top surface 46d is bonded to the inner surface 44 of the glass plate 42.

It is desired that the frame body 46 be formed to be thin to a certain extent so as not to block the output light of the light emitting device 20 output from the opening of the recess 34 at a wide angle of light distribution from the opening of the recess 34. Meanwhile, it is desired that the frame body 46 is formed to have a certain thickness in order to secure a height of the inner circumferential surface 46b of the frame body 46. The thickness $t_2$ of the frame body 46 is, for example, 20 µm-200 µm, and, preferably, 50 µm-150 µm.

The sealing structure 50 includes a first metal layer 51, a second metal layer 52, and a metal bonding part 53.

The first metal layer 51 is provided on the top surface 31 of the package substrate 30 in a shape of a frame. The first metal layer 51 has a rectangular frame shape corresponding to the rectangular package substrate 30 and is chamfered into a round form at the four corners. The first metal layer 51 is formed by, for example, metalizing a ceramic substrate. The first metal layer 51 is formed by plating a base member containing tungsten (W) or molybdenum (Mo) with nickel (Ni), gold (Au), etc. and has, for example, a stack structure of W/Ni/Au. The first metal layer 51 is bonded to the metal bonding part 53.

The second metal layer 52 is provided at least on the bottom surface 46a and the inner circumferential surface 46b of the frame body 46. The second metal layer 52 may be provided on the outer circumferential surface 46c, as shown in the figure. The second metal layer 52 is formed by fitting the frame body 46 to the glass plate 42 and then plating the frame body 46. The second metal layer 52 may be a multilayer film in which nickel (Ni) and gold (Au) are built on the surface of the frame body 46 in the stated order. The second metal layer 52 is bonded to the metal bonding part 53.

The metal bonding part 53 is provided between the first metal layer 51 and the second metal layer 52 and bonds the package substrate 30 and the window member 40 to seal a space therebetween at the outer circumference of the package. The metal bonding part 53 is configured to fill a space between the first metal layer 51 and the second metal layer 52, and a portion of the metal bonding part 53 is provided on the inner circumferential surface 46b of the frame body 46. The metal bonding part 53 is provided to form a fillet along the inner circumferential surface 46b of the frame body 46.

The metal bonding part 53 is made of a metal material having a low melting point and contains, for example, a gold-tin (AuSn) or silver-tin (AgSn) alloy. The metal bonding part 53 spreads between the first metal layer 51 and the second metal layer 52 when melted to form eutectic bonding. It is preferred that the metal bonding part 53 be made of gold-tin containing tin (Sn) in an amount of 20% wt 24% wt to ensure high sealing reliability and a melting temperature of 300° C. or lower.

FIG. 2 schematically shows the dimensions of the package substrate 30 and the window member 40. As shown in the figure, the outer dimension $w_{20}$ of the window member 40 (frame body 46) is smaller than the outer dimension $w_{10}$ of the package substrate 30. The outer dimension $w_{11}$ of the first metal layer 51 is smaller than the outer dimension $w_{20}$ of the frame body 46, and the inner dimension $w_{12}$ of the first metal layer 51 is smaller than the inner dimension $w_{22}$ of the frame body 46.

In one example, the outer dimension $w_{10}$ of the package substrate 30 is 3.5 mm, the outer dimension $w_{11}$ of the first metal layer 51 is 3.2 mm, the inner dimension $w_{12}$ of the first metal layer 51 is 2.3 mm, and the width $w_{13}$ of the first metal layer 51 is 0.45 mm. Further, the outer dimension $w_{20}$ of the window member 40 is 3.4 mm, the inner dimension $w_{22}$ of the frame body 46 is 2.8 mm, and the width W23 of the frame body 46 is 0.3 mm. Further, the thickness $t_1$ of the glass plate 42 is 170 µm, and the thickness $t_2$ of the frame body 46 is 150 µm. In this example, the inner dimension difference between the first metal layer 51 and the frame body 46 is 0.5 mm, and the width $w_3$ between the inner circumference of the first metal layer 51 (outer circumference of the recess 34) and the inner circumferential surface 46b of the frame body 46 is 250 µm. Therefore, the width $w_3$ of the range of the area on the first metal layer 51 not overlapped by the frame body 46 is larger than the thickness $t_2$ of the frame body 46.

Figure 3:
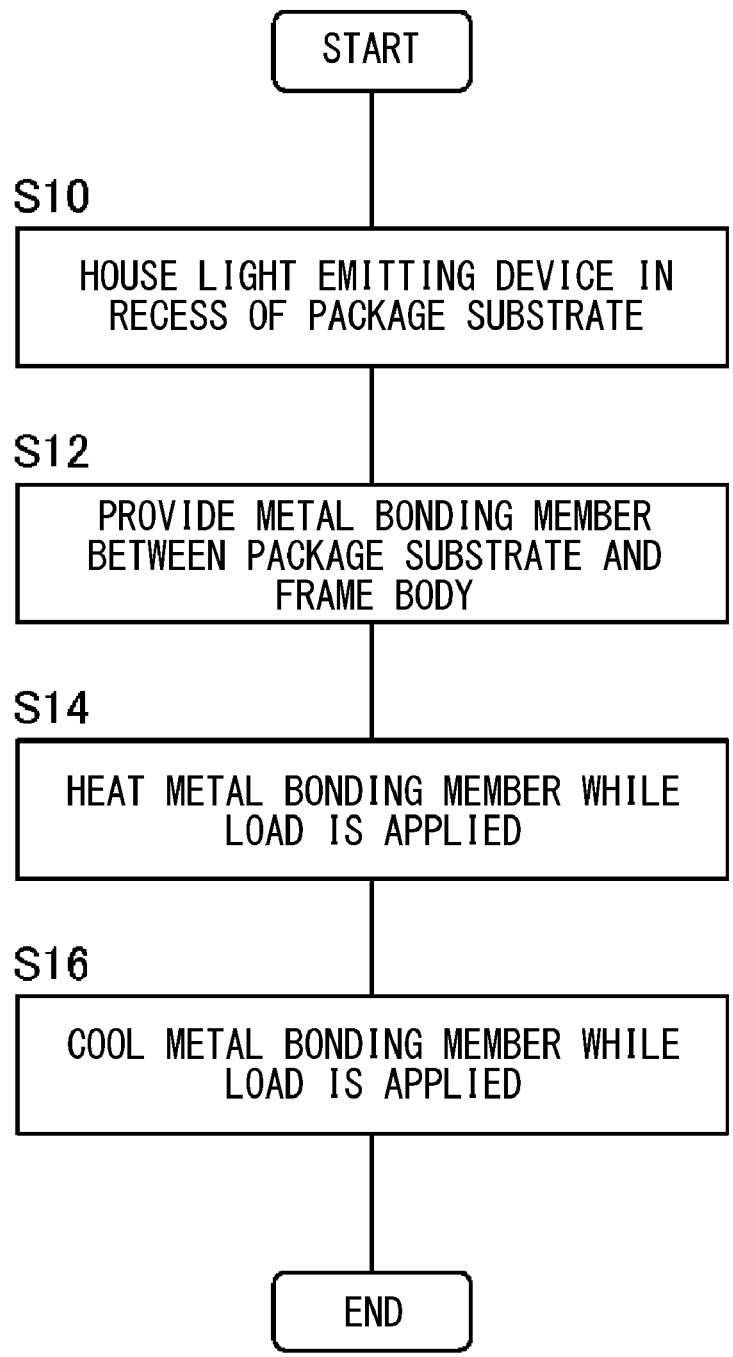
FIG. 3 is a flowchart showing a method of manufacturing the light emitting apparatus according to the embodiment.

A description will now be given of a method of manufacturing the light emitting apparatus 10. FIG. 3 is a flowchart showing a method of manufacturing the light emitting apparatus 10 according to the embodiment. The light emitting device 20 is housed in the recess 34 of the package substrate 30 (S10), the window member 40 is provided to cover the opening of the recess 34, and the metal bonding member 56 is provided between the top surface 31 of the package substrate 30 and the bottom surface 46a of the frame body 46 (see FIG. 4 referenced later) (S12). The metal bonding member is then heated and melted while a load is being applied between the package substrate 30 and the window member 40 (S14). Subsequently, the metal bonding part 53 is cooled and solidified while a load is being applied between the package substrate 30 and the window member 40 (S16).

Figure 4:
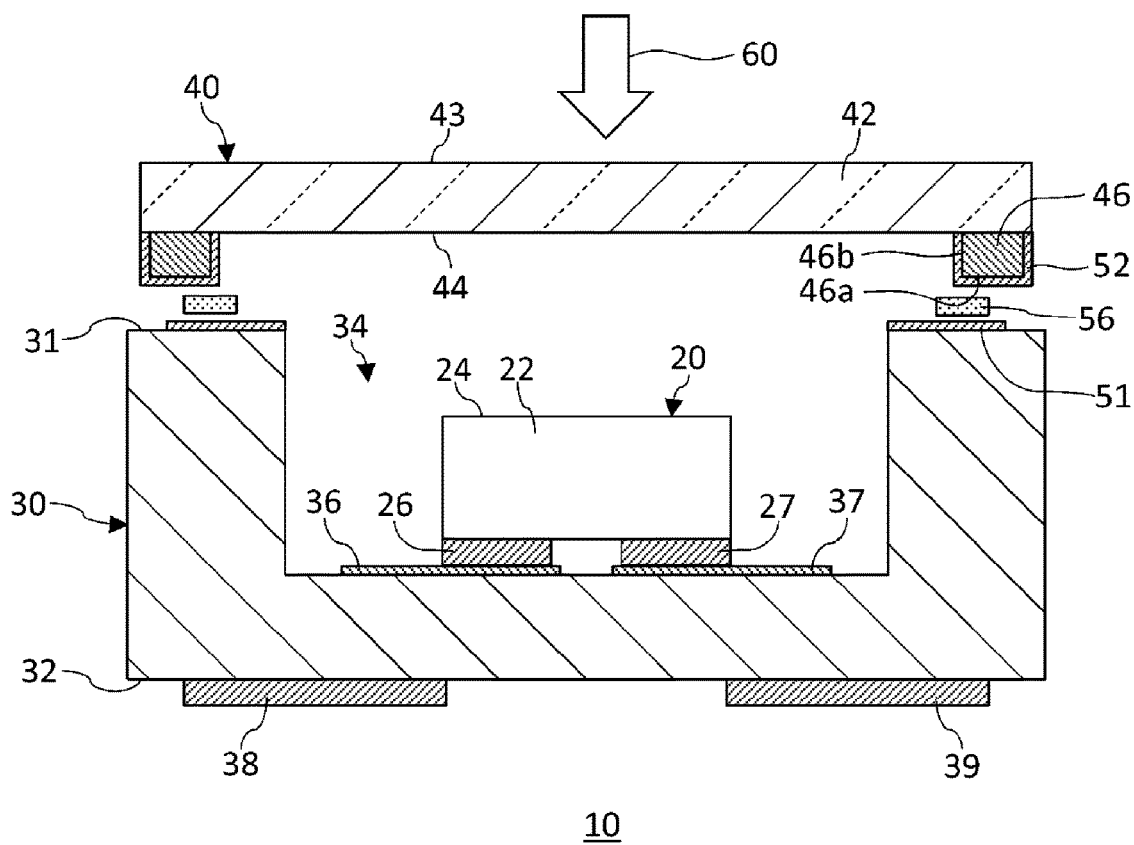
FIG. 4 is a cross-sectional view schematically showing a step of manufacturing the light emitting apparatus.

FIG. 4 is a cross-sectional view schematically showing a step of manufacturing the light emitting apparatus 10 and shows a step of providing the metal bonding member 56 and positioning the package substrate 30 and the window member 40. The package substrate 30 and the window member 40 are positioned by, for example, aligning the central positions of the package substrate 30 and the window member 40. The package substrate 30 and the window member 40 may be positioned such that one of the four corners of the package substrate 30 is aligned with one of the four corners of the window member 40. In this case, the central positions of the package substrate 30 and the window member 40 dimensioned according to the above example will be misaligned within a range of ±50 µm. Regardless, the inner circumferential surface 46b of the frame body 46 is positioned on the first metal layer 51.

The metal bonding member 56 is provided between the top surface 31 of the package substrate 30 and the bottom surface 46a of the frame body 46. The metal bonding member 56 is a gold-tin preform shaped in a rectangular frame corresponding to the area where the top surface 31 of the package substrate 30 and the bottom surface 46a of the frame body 46 are bonded. The metal bonding member 56 has, for example, an inner dimension and an outer dimension smaller than those of the first metal layer 51. For example, the outer dimension is 3.0 mm, and the inner dimension is 2.6 mm. The metal bonding member 56 may be temporarily secured to the first metal layer 51 or the second metal layer 52. The thickness of the metal bonding member 56 is about 10 µm~50 µm, and, preferably, about 15 µm~30 µm. By sealing the package by using a preform of such a shape and thickness while a load 60 is being applied, the metal bonding part 53 of a thickness of about 5 µm~20 µm is formed. The load 60 applied during sealing is 50 g or larger, and, preferably, 100 g or larger, and, more preferably, 200 g or larger.

The metal bonding member 56 is heated and melted while the load 60 is being applied and spreads between the first metal layer 51 and the second metal layer 52. The metal bonding member 56 spreads in the horizontal direction along the first metal layer 51 and spreads in the vertical direction along the second metal layer 52 provided on the inner circumferential surface 46*b* of the frame body 46. Therefore, a portion of the metal bonding member 56 is stretched toward the inner surface 44 of the glass plate 42 along the inner circumferential surface 46*b* of the frame body 46 and forms a fillet on the inner circumferential surface 46*b*.

It is preferred that the step of heating and melting the metal bonding member 56 be performed in an atmosphere of inert gas such as nitrogen ($N_2$). This prevents oxidation the gold-tin preform in a melted state and fills the interior of the package with the inert gas. However, the heating and melting step according to the embodiment may be performed in an atmosphere of dry air containing oxygen ($O_2$). By heating and melting the gold-tin preform while a load is being applied, it is possible to seal the package while also preventing oxidation of the metal bonding member 56 between the first metal layer 51 and the second metal layer 52.

Figure 5:
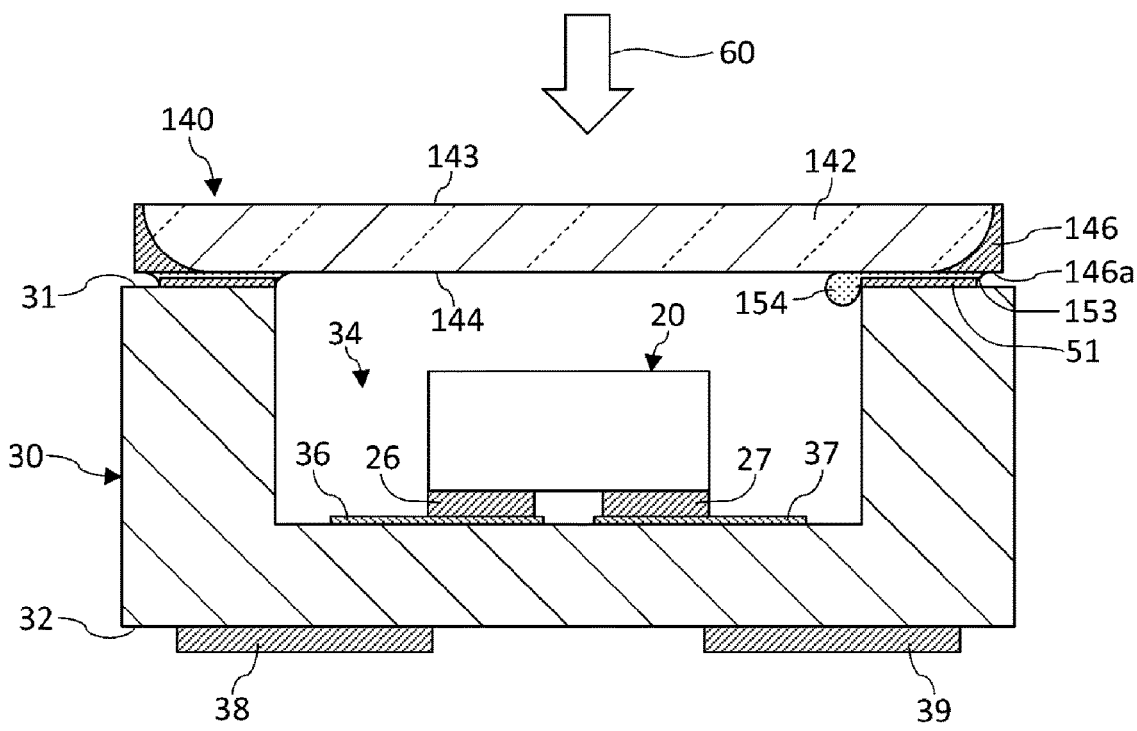
FIG. 5 is a cross-sectional view schematically showing a light emitting apparatus according to a comparative example.

A description will be given of the advantage provided by the embodiment with reference to a comparative example. FIG. 5 is a cross-sectional view schematically showing a light emitting apparatus 110 according to a comparative example. The comparative example differs from the aforementioned embodiment in that a window member 140 is configured such that a frame body 146 is formed to surround the outer circumference of a glass plate 142, and an inner surface 144 of the glass plate 142 and a bottom surface 146*a* of the frame body 146 form a single flat surface. The first metal layer 51 formed on the package substrate 30 and the frame body 146 of the window member 140 are bonded by the metal bonding part 153.

In the comparative example, an overhang 154 is formed as a result of a portion of the metal bonding member protruding into the interior of the package and being solidified into a spherical shape. The overhang 154 is formed as a result of a portion of the metal bonding member being extruded from between the package substrate 30 and the window member 140 as the package substrate 30 and the window member 140 are bonded while a load is being loaded. When the overhang 154 is formed, a portion of the deep ultraviolet light emitted by the light emitting device 20 is blocked by the overhang 154 so that the efficiency of extracting light outside can be reduced. If the metal bonding member does not stay on the inner surface 144 of the window member 140 in the form of the overhang 154 and flows toward the packaging surface in the recess 34, a short circuit between the first inner electrode 36 and the second inner electrode 37 may result. Meanwhile, if the amount of gold-tin preform is reduced to prevent a portion of the metal bonding member from being extruded, the package may not be bonded with high sealing reliability. The top surface 31 of the package substrate 30 may not be a completely flat surface for reasons related to manufacturing, etc., and microasperities may be produced depending on the location. Therefore, the amount of the bonding member may be insufficient in a part of the top surface 31 of the package substrate 30, resulting in improper sealing and bonding.

According to the embodiment, on the other hand, the inner circumferential surface 46*b* of the frame body 46 is positioned on the first metal layer 51. Therefore, the metal bonding member extruded from between the first metal layer 51 and the bottom surface 46*a* of the frame body 46 can be stretched vertically upward toward the glass plate 42. This prevents the metal bonding member from being stretched only in the horizontal direction to form the overhang 154 or flowing down into the recess 34. Thus, the embodiment prevents the yield from being lowered due to a manufacturing failure and, at the same time, allows highly reliable sealing and bonding to be performed while applying a load during the process, using an amount of metal bonding member sufficient for sealing.

In accordance with the embodiment, both the advantage of preventing the metal bonding member from falling and the advantage of preventing reduction in the light extraction efficiency due to the thickness of the frame body 46 are achieved by configuring the frame body 46 to have a thickness $t_2$ of not less than 20 μm and not more than 200 μm. If the frame body 46 is configured to have a thickness larger than 200 μm, a portion of the deep ultraviolet light output from the light emitting device 20 at a wide angle of light distribution (e.g., 150°) is blocked by the frame body 46. The thickness $t_2$ of the frame body 46 smaller than 20 μm results in a smaller space for accommodating the extrusion of the metal bonding member and failure to prevent the metal bonding member from flowing down. In accordance with the embodiment, on the other hand, the sealing reliability, the yield of manufacturing, and the light extraction efficiency are improved by adjusting the thickness $t_2$ of the frame body 46 properly.

The embodiment makes it easy to check the properness of sealing and bonding by visually inspecting the fillet formed on the inner circumferential surface 46*b* of the frame body 46. The fillet on the inner circumferential surface 46*b* is formed by extrusion from between the top surface 31 of the package substrate 30 and the bottom surface 46*a* of the frame body 46 so that it is known that the space between the top surface 31 and the bottom surface 46*a* is filled with the metal bonding member by identifying the fillet. If the fillet is not formed on the inner circumferential surface 46*b*, on the other hand, it suggests that the space between the top surface 31 and the bottom surface 46*a* is not filled with the metal bonding member and sealing and bonding is not done properly. Thus, the embodiment makes it possible to check the sealing performance easily by seeing whether the fillet is formed over the entirety of the inner circumferential surface 46*b* of the frame body 46 by using an image recognition technique, or the like.

Described above is an explanation based on an exemplary embodiment. The embodiment is intended to be illustrative only and it will be understood by those skilled in the art that various design changes are possible and various modifications are possible and that such modifications are also within the scope of the present invention.

In the embodiment and the variation described above, the case of including only a light emitting device in the package of a light emitting apparatus is shown. In a further variation, electronic components other than a light emitting device may be built in the package to provide additional functions. For example, a Zener diode for protecting the light emitting device from an electric surge may be built in the housing. A fluorescent body for converting the wavelength of the light output by the light emitting device may be built in. Still alternatively, an optical device for controlling the orientation of the light emitted by the light emitting device may be built in.

In the embodiment and the variation described above, a light emitting apparatus in which a semiconductor light emitting device is sealed in the package is shown. In a further variation, the sealing structure described above may be used to seal a light receiving device. For example, the package structure described above may be used to seal a light receiving device for receiving deep ultraviolet light. In essence, the package described above may be used to seal an optical semiconductor device.

It should be understood that the invention is not limited to the above-described embodiment but may be modified into various forms on the basis of the spirit of the invention. Additionally, the modifications are included in the scope of the invention.

What is claimed is:

1. An optical semiconductor apparatus comprising:
   a package substrate that includes a recess that opens on a top surface of the package substrate;
   an optical semiconductor device housed in the recess;
   a window member provided to cover an opening of the recess; and
   a sealing structure that seals a space between the package substrate and the window member, wherein
   the window member includes a glass plate having an inner surface that faces the optical semiconductor device and a frame body provided on the inner surface of the glass plate,
   the sealing structure includes a first metal layer provided in a shape of a frame on the top surface of the package substrate, a second metal layer provided on a bottom surface and an inner circumferential surface of the frame body, and a metal bonding part provided between the first metal layer and the second metal layer, at least a portion of the metal bonding part being provided on the inner circumferential surface, and
   in a planar view in a direction in which the package substrate and the window member overlap, a width of half a difference in inner dimension between the frame body and the first metal layer is larger than a thickness of the frame body.

2. The optical semiconductor apparatus according to claim 1, wherein
   an outer dimension of the frame body is smaller than an outer dimension of the package substrate, an inner dimension of the frame body is larger than an inner dimension of the recess of the package substrate, and an outer dimension of the first metal layer is smaller than an outer dimension of the frame body.

3. The optical semiconductor apparatus according to claim 1, wherein
   the optical semiconductor device is a light emitting device configured to emit deep ultraviolet light, and the window member is configured such that transmittance for the deep ultraviolet light is 80% or higher.

4. A method of manufacturing the optical semiconductor apparatus according to claim 1, comprising:
   housing the optical semiconductor device in the recess of the package substrate;
   providing the window member to cover the opening of the recess; and
   sealing a space between the package substrate and the window member, wherein
   the sealing includes heating a metal bonding member provided between the first metal layer and the second metal layer while a load is being applied between the package substrate and the window member.

5. The method of manufacturing an optical semiconductor apparatus according to claim 4, wherein
   in a planar view in a direction in which the package substrate and the window member overlap, a width of half a difference in inner dimension between the frame body and the first metal layer is larger than a thickness of the frame body.

6. The method of manufacturing an optical semiconductor apparatus according to claim 4, wherein
   the sealing includes cooling the metal bonding member while a load is being applied between the package substrate and the window member, after heating the metal bonding member.

7. The method of manufacturing an optical semiconductor apparatus according to claim 4, wherein
   the metal bonding member is an gold-tin (AuSn) metal plate having a shape of a frame corresponding to the bottom surface of the frame body.

8. An optical semiconductor apparatus comprising:
   a package substrate that includes a recess that opens on a top surface of the package substrate;
   an optical semiconductor device housed in the recess;
   a window member provided to cover an opening of the recess; and
   a sealing structure that seals a space between the package substrate and the window member, wherein
   the window member includes a glass plate having an inner surface that faces the optical semiconductor device and a frame body provided on the inner surface of the glass plate,
   the sealing structure includes a first metal layer provided in a shape of a frame on the top surface of the package substrate, a second metal layer provided on a bottom surface and an inner circumferential surface of the frame body, and a metal bonding part provided between the first metal layer and the second metal layer, at least a portion of the metal bonding part being provided on the inner circumferential surface, and
   a height of the frame body from the bottom surface to the inner surface of the glass plate is not less than 10 μm and not more than 200 μm.

9. An optical semiconductor apparatus comprising:
   a package substrate that includes a recess that opens on a top surface of the package substrate;
   an optical semiconductor device housed in the recess;
   a window member provided to cover an opening of the recess; and
   a sealing structure that seals a space between the package substrate and the window member, wherein
   the window member includes a glass plate having an inner surface that faces the optical semiconductor device and a frame body provided on the inner surface of the glass plate,
   the sealing structure includes a first metal layer provided in a shape of a frame on the top surface of the package substrate, a second metal layer provided on a bottom surface and an inner circumferential surface of the frame body, and a metal bonding part provided between the first metal layer and the second metal layer, at least a portion of the metal bonding part being provided on the inner circumferential surface,
   the glass plate is made from a borate glass having a thickness of 300 μm or smaller,
   the frame body is made of a kovar alloy, and
   the metal bonding part includes gold-tin (AuSn).

* * * * *